United States Patent
Chen et al.

(10) Patent No.: US 12,002,734 B2
(45) Date of Patent: Jun. 4, 2024

(54) CIRCUIT PREARRANGED HEAT DISSIPATION EMBEDDED PACKAGING STRUCTURE AND MANUFACTURING METHOD THEREOF

(71) Applicant: Zhuhai ACCESS Semiconductor Co., Ltd, Guangdong (CN)

(72) Inventors: Xianming Chen, Guangdong (CN); Lei Feng, Guangdong (CN); Benxia Huang, Guangdong (CN); Jindong Feng, Guangdong (CN); Minxiong Li, Guangdong (CN); Shigui Xin, Guangdong (CN); Wenshi Wang, Guangdong (CN)

(73) Assignee: ZHUHAI ACCESS SEMICONDUCTOR CO., LTD, Guangdong (CN)

( * ) Notice: Subject to any disclaimer, the term of this patent is extended or adjusted under 35 U.S.C. 154(b) by 339 days.

(21) Appl. No.: 17/411,144

(22) Filed: Aug. 25, 2021

(65) Prior Publication Data
US 2022/0068760 A1    Mar. 3, 2022

(30) Foreign Application Priority Data

Aug. 25, 2020    (CN) .......................... 202010876334.0

(51) Int. Cl.
*H01L 23/40*    (2006.01)
*H01L 23/373*    (2006.01)

(52) U.S. Cl.
CPC .......... *H01L 23/40* (2013.01); *H01L 23/3736* (2013.01)

(58) Field of Classification Search
CPC ................ H01L 23/40; H01L 23/3736; H01L 2224/04105; H01L 21/568; H01L 23/3121; H01L 24/19; H01L 23/5389; H01L 2224/2518; H01L 21/50; H01L 21/56; H01L 23/367; H01L 23/49822; H01L 23/49838; H01L 23/315; H01L 23/36; H01L 23/528; H05K 1/0207; H05K 1/115;
(Continued)

(56) References Cited

U.S. PATENT DOCUMENTS 9,548,277 B2 *    1/2017   Vogt .................... H01L 25/0652
9,911,700 B2 *    3/2018   Hurwitz ............ H01L 23/53238
(Continued)

FOREIGN PATENT DOCUMENTS

CN    106997870 A    8/2017

*Primary Examiner* — Caleen O Sullivan
(74) *Attorney, Agent, or Firm* — The PL Law Group, PLLC

(57) ABSTRACT

A circuit prearranged heat dissipation embedded packaging structure according to an embodiment of the present disclosure includes at least one chip and a support frame surrounding the at least one chip. The support frame may include a via pillar passing through the support frame in the height direction, a first wiring layer on a first surface of the support frame, and a heat dissipation layer on the back face of the chip. The first wiring layer is flush with or higher than the first surface, the first wiring layer is in conductive connection with the heat dissipation layer, a gap between the chip and the frame is completely filled with the dielectric material, a second wiring layer is formed on a terminal face of the chip, and the second wiring layer is in conductive connection with the first wiring layer through the via pillar.

20 Claims, 4 Drawing Sheets

(58) Field of Classification Search
CPC ...... H05K 3/064; H05K 3/188; H05K 3/4623; H05K 3/4697; H05K 2201/0145; H05K 2201/0154
USPC ......................................................... 257/712
See application file for complete search history.

(56) References Cited

U.S. PATENT DOCUMENTS

| | | | |
|---|---|---|---|
| 11,322,428 B2* | 5/2022 | Yen | H01L 23/4825 |
| 11,445,617 B2* | 9/2022 | Yang | H01L 23/49822 |
| 2015/0228416 A1* | 8/2015 | Hurwitz | H01G 4/1209 |
| | | | 174/257 |
| 2015/0279814 A1* | 10/2015 | Hurwitz | H01L 24/82 |
| | | | 257/774 |
| 2020/0389969 A1* | 12/2020 | Ikeda | H05K 1/025 |

* cited by examiner

CIRCUIT PREARRANGED HEAT DISSIPATION EMBEDDED PACKAGING STRUCTURE AND MANUFACTURING METHOD THEREOF

CROSS-REFERENCE TO RELATED APPLICATION

This application claims the benefit under 35 USC § 119(a) of Chinese Patent Application No. 202010876334.0, filed on Aug. 25, 2020, in the China Intellectual Property Office, the entire disclosure of which is incorporated herein by reference for all purposes.

BACKGROUND

1. Technical Field

The invention relates to an electronic device packaging structure, in particular to a circuit prearranged heat dissipation embedded packaging structure and a manufacturing method thereof.

2. Background of the Invention

As the application scenarios of semiconductor devices become more and more extensive, and the degree of integration becomes higher and higher, heat dissipation has become one of the primary considerations in the design requirements of the embedded packaging. At present, the main heat dissipation scheme is that a metal heat conducting via pillar is formed on the back face of an embedded device of a packaging substrate for heat dissipation, and the heat dissipation efficiency is far higher than that of a thermal contact layer material. Since the thermal conductivity coefficient of the thermal contact layer material is generally only 0.8 W/(m·K)-2 W/(m·K), compared with the scenario that the device is in direct contact with the metal layer, the heat dissipation effect is nearly 150 times poorer.

Chinese Patent Publication CN106997870B discloses an embedded packaging structure, as shown in FIG. 1, in which a chip 12 has a terminal face 14 and a back face 16 separated by the height of the chip. The back face 16 of the chip is covered by a thick copper layer 36 and is coplanar with one face of the packaging material. Due to the structure in which the thick copper layer covers the back face of the whole chip, the heat dissipation of the chip is facilitated.

However, in the prior art, the thick copper layer only covers the back face of the chip, and other areas of the substrate are not covered by thick copper so that the problem of warping of local areas of the substrate is easily caused; the copper layer can only be arranged on the back face of the chip for heat dissipation, and the heat dissipation area is limited; moreover, after the storey-addition of the back thick copper layer, the copper surface needs to be exposed through a copper pillar method so that the thickness of the storey-addition dielectric layer is difficult to control, and the dielectric layer and the copper thickness are difficult to reach the specification.

SUMMARY

The implementation of the invention involves providing a circuit prearranged heat dissipation embedded packaging structure and a manufacturing method thereof to solve the technical problem. According to the invention, a wiring layer is preset in the support frame, so that the local warping problem of the embedded packaging substrate is improved, and the operation difficulty and plate folding risk in the substrate manufacturing process are reduced; the rewiring process of the embedded chip is reduced, the defects caused by the back end process are reduced, and the yield of the embedded substrate is improved; the heat dissipation area is increased, and the heat dissipation efficiency is further improved; moreover, the problem of glass fiber exposure caused by the thinning of the frame nog plate is solved through the preset wiring layer, and the reliability problem caused by glass fiber exposure is solved.

A first aspect of the present invention relates to a circuit prearranged heat dissipation embedded packaging structure, including at least one chip and a support frame surrounding the at least one chip. The support frame includes a via pillar passing through the support frame in a height direction, a first wiring layer on a first surface of the support frame, and a heat dissipation layer on the back face of the chip, the first wiring layer is flush with or higher than the first surface, the first wiring layer is in conductive connection with the heat dissipation layer, a gap between the chip and the frame is completely filled with a dielectric material, a second wiring layer is formed on a terminal face of the chip, and the second wiring layer is in conductive connection with the first wiring layer through the via pillar.

In some implementations, the dielectric material includes a prepreg, a film-like organic resin, or a combination thereof.

In some implementations, the support frame includes an organic electric insulating material; preferably, the organic electric insulating material includes polyimide, epoxy resin, bismaleimide/triazine resin, polyphenyl ether, polyacrylate, prepreg, film-like organic resin, or a combination thereof.

In some implementations, the via pillar includes a copper via pillar.

In some implementations, a material of the heat dissipation layer is selected from at least one of copper, nickel, silver, gold, and an alloy thereof.

In some implementations, an additional layer is also formed on the first wiring layer and/or the second wiring layer by performing storey-addition to form a multilayer interconnection structure. Preferably, the additional layer includes a dielectric layer, a wiring layer, and a via pillar layer.

In some implementations, a solder mask layer and a solder mask window are provided on the heat dissipation layer and the first wiring layer and the second wiring layer, respectively.

The second aspect of the invention provides a manufacturing method for a circuit prearranged heat dissipation embedded packaging structure, which includes the following steps:

(a) prefabricating a support frame, wherein the support frame includes a via pillar passing through the support frame in a height direction, a first wiring layer on a first surface of the support frame, and a through cavity surrounded by the support frame, the first wiring layer being flush with or higher than the first surface, and the first wiring layer being in conductive connection with the via pillar;

(b) installing a chip in the through cavity so that a back face of the chip faces the first surface, and completely fills a gap between the chip and the frame with a dielectric material;

(c) forming a heat dissipation layer on the back face of the chip, and enabling the heat dissipation layer to be in conductive connection with the first wiring layer; and (d) forming a second wiring layer on a terminal face of the chip, wherein the second wiring layer is in conductive connection with the first wiring layer through the via pillar.

In some implementations, step (b) further includes:

(b1) attaching an adhesive layer on a second surface of the support frame;

(b2) sticking and fixing the terminal face of the chip on the adhesive layer;

(b3) applying the dielectric material on the second surface of the support frame to completely fill the gap between the chip and the frame;

(b4) thinning the dielectric material to expose the first wiring layer;

(b5) exposing the back face of the chip through plasma etching or laser trepanning; and (b6) removing the adhesive layer.

Preferably, the support frame includes an organic electric insulating material, and the organic electric insulating material includes polyimide, epoxy resin, bismaleimide/triazine resin, polyphenyl ether, polyacrylate, prepreg, film-like organic resin, or a combination thereof.

In some implementations, the adhesive layer includes a tape.

In some implementations, the dielectric material includes a prepreg, a film-like organic resin, or a combination thereof.

In some implementations, the adhesive layer is removed by decomposing the adhesive layer by heating or irradiating ultraviolet light.

In some implementations, step (c) includes:

(c1) depositing a first metal seed layer on the first surface of the support frame and the back face of the chip;

(c2) applying a first etching stop layer on the second surface of the support frame;

(c3) performing electroplating on the first metal seed layer to form a first metal layer;

(c4) applying a first photoresist layer on the first metal layer;

(c5) patterning the first photoresist layer to form a feature pattern;

(c6) etching the first metal layer through the first feature pattern to form a heat dissipation layer, wherein the heat dissipation layer is in conductive connection with the first wiring layer; and (c7) removing the first etching stop layer and the first photoresist layer and etching away the first metal seed layer.

Preferably, step (c2) includes electroplating copper, nickel, silver, gold, or an alloy thereof on the first metal seed layer to form a first metal layer.

In some implementations, step (d) includes:

(d1) applying a second etching stop layer on the heat dissipation layer;

(d2) depositing a second metal seed layer on a second surface of the support frame;

(d3) performing electroplating on the second metal seed layer to form a second metal layer;

(d4) applying a second photoresist layer on the second metal layer;

(d5) patterning the second photoresist layer to form a second feature pattern;

(d6) etching the second metal layer through the second feature pattern to form a second wiring layer; and (d7) removing the second etching stop layer and the second photoresist layer, and etching away the second metal seed layer.

Preferably, the first metal seed layer and the second metal seed layer include titanium, copper, or an alloy thereof.

In some implementations, the method further includes applying a solder mask layer on the heat dissipation layer, the first wiring layer, and the second wiring layer respectively, and performing surface treatment on the exposed metal to form a solder mask window.

In some implementations, the method further includes the following steps:

(e) performing storey-addition process on the heat dissipation layer and/or the second wiring layer to form an additional layer to form a multilayer interconnection structure.

Preferably, step (e) further includes:

(e1) laminating the dielectric material on the heat dissipation layer and the second wiring layer respectively to form a first dielectric layer and a second dielectric layer;

(e2) respectively forming a first via and a second via in the first dielectric layer and the second dielectric layer;

(e3) depositing a third metal seed layer on the first dielectric layer and in the first via, and depositing a fourth metal seed layer on the second dielectric layer and in the second via;

(e4) electroplating copper on the third metal seed layer to form a first copper layer and a first copper pillar, and electroplating copper on the fourth metal seed layer to form a second copper layer and a second copper pillar;

(e5) respectively applying a third photoresist layer and a fourth photoresist layer on the first copper layer and the second copper layer;

(e6) patterning the third photoresist layer and the fourth photoresist layer to form a third feature pattern and a fourth feature pattern;

(e7) respectively etching the first copper layer and the second copper layer through the third feature pattern and the fourth feature pattern to form a third wiring layer and a fourth wiring layer; and (e8) removing the third photoresist layer and the fourth photoresist layer, and etching away the third metal seed layer and the fourth metal seed layer.

Preferably, a first via and a second via are respectively formed in the first dielectric layer and the second dielectric layer by a laser process;

In some implementations, applying a solder mask layer on the surfaces of the third wiring layer and the fourth wiring layer respectively, and surface treating the exposed metal to form a solder mask window are further included.

BRIEF DESCRIPTION OF THE DRAWINGS

For a better understanding of the invention and to show the embodiment thereof, reference is now made, purely by way of example, to the accompanying drawings.

When referring to the accompanying drawings, it must be emphasized that the specific illustrations are exemplary and only for the purpose of demonstrative discussion of the preferred embodiments of the present invention, and are presented based on the provision that they are considered to be the most useful and understandable illustration of the description of the principles and concepts of the present invention. In this regard, no attempt is made to show structural details of the invention in more detail than is necessary for a fundamental understanding of the invention; the description with reference to the drawings will enable one skilled in the art to recognize how the several forms of the invention may be embodied in practice. In the drawings.

DETAILED DESCRIPTION OF THE EMBODIMENTS

Figure 1:
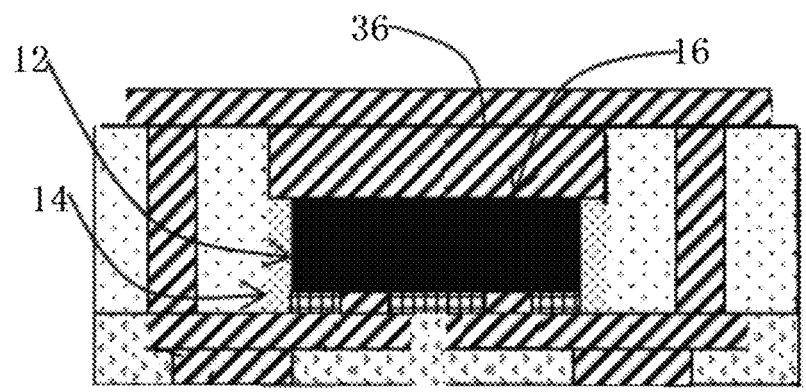
FIG. 1 is a schematic cross-sectional view of an embedded packaging structure having a heat dissipation layer in the prior art.
Figure 2:
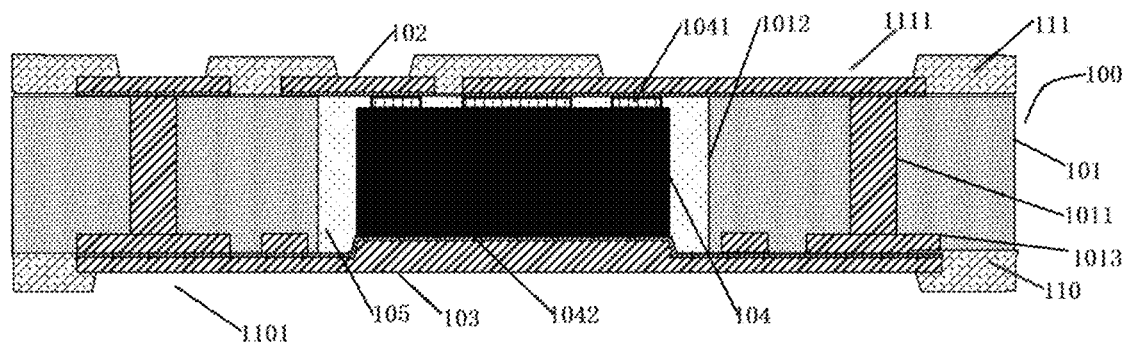
FIG. 2 is a schematic cross-sectional view of a circuit prearranged heat dissipation embedded packaging structure according to one implementation of the present invention.

Referring to FIG. 2, a schematic cross-sectional view of a circuit prearranged heat dissipation embedded packaging structure 100 is shown. The packaging structure 100 includes a support frame 101, a second wiring layer 102 positioned on the upper surface of the support frame 101, and a heat dissipation layer 103 positioned on the lower surface of the support frame 101. A via pillar 1011 passing through the support frame 101, a through cavity 1012 and a first wiring layer 1013 preset in the upper surface of the support frame 101 are provided in the support frame 101. The via pillar 1011 conductively connects the first wiring layer 1013 with the second wiring layer 102, and the first wiring layer 1013 is conductively connected with the heat dissipation layer 103. The material of the heat dissipation layer 103 is selected from metals having good thermal conductivity, preferably at least one of copper, nickel, silver, gold, and alloys thereof. At least one via pillar 1011 is provided in the support frame 101, and the via pillar 1011 is a copper via pillar serving as an IO channel.

The outer surface of the first wiring layer 1013 is flush with or beyond the lower surface of the support frame 101. The first wiring layer 1013 is prefabricated in the support frame 101 and conductively connected with the heat dissipation layer 103 so that the stress of the packaging structure 100 is uniformly distributed, and the problem of the warping of the local substrate is solved; moreover, the first wiring layer 1013 increases the heat dissipation area, solves the problem of single heat dissipation on the back face of the chip, and improves the heat dissipation efficiency by dispersing heat to the first wiring layer 1013; at the same time, heat can be further dispersed to the second wiring layer 102 through the copper via pillar 1011, thereby further improving heat dissipation efficiency.

The chip 104 is embedded in the through cavity 1012, the chip terminal 1041 is connected with the second wiring layer 102, and the back face 1042 of the chip is covered by the heat dissipation layer 103 so that double-sided heat dissipation of the chip is realized. The through cavity 1012 is also completely filled with a dielectric material 105 to coat the chip 104. In general, chip 104 includes at least one assembly selected from an integrated circuit, a resistor, a capacitor, an inductor, flash memory, and an integrated passive device. The chip can be a single-sided chip with a terminal on one side, or a double-sided chip or a superposed chip with terminals on both sides of the chip.

In some implementations, multiple chips may be included within the same support frame. The multiple chips are separated by dielectric material 105.

The dielectric material 105 includes a prepreg (PP), a film-like organic resin (ABF), or a combination thereof for example, a combination of PP and ABF. The material of the support frame 101 is an organic electrical insulating material, which may be polyimide, epoxy, bismaleimide/triazine resin (BT), polyphenyl ether, polyacrylate, prepreg (PP), film-like organic resin (ABF), or a combination thereof, for example, a combination of BT and PP.

As shown in FIG. 2, the packaging structure 100 includes a first solder mask layer 110 formed on the heat dissipation layer 103 and a second solder mask layer 111 formed on the second wiring layer 102. A first solder mask window 1101 and a second solder mask window 1111 are provided in the first solder mask layer 110 and the second solder mask layer 111, respectively.

Figure 3:
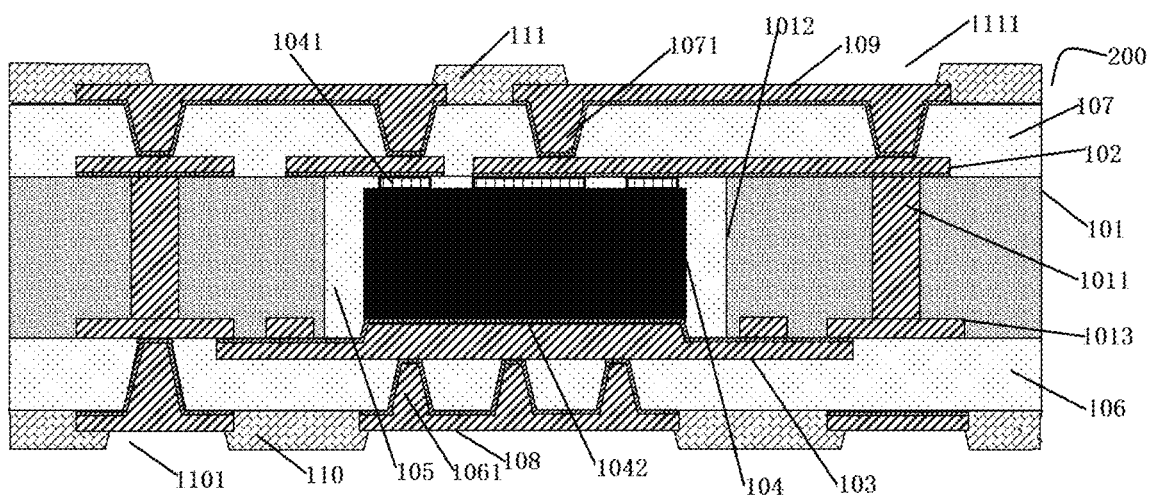
FIG. 3 is a schematic cross-sectional view of a circuit prearranged heat dissipation embedded packaging structure according to another implementation of the present invention.

Referring to FIG. 3, a schematic cross-sectional view of a circuit prearranged heat dissipation embedded packaging structure 200 is shown. The difference between the packaging structure 200 and the packaging structure 100 is that a first dielectric layer 106 is formed on the heat dissipation layer 103 and a second dielectric layer 107 is formed on the second wiring layer 102, and the first dielectric layer 106 and the second dielectric layer 107 may include the same material or different materials. A third wiring layer 108 is formed on the first dielectric layer 106, a fourth wiring layer 109 is provided on the second dielectric layer 107, a first copper pillar 1061 passing through the first dielectric layer 106 can communicate the heat dissipation layer 103 with the third wiring layer 108, and a second copper pillar 1071 passing through the second dielectric layer 107 can communicate the second wiring layer 102 with the fourth wiring layer 109. The first Cu pillar 1061 and the second Cu pillar 1071 may be solid copper pillar or hollow copper columns with copper plated edges. Therefore, when the packaging structure 100 forms the packaging structure 200 by storey-addition, and the heat dissipation layer 103 can still be connected with the surface circuit of the packaging structure 200 through the conductivity, thereby further increasing the heat dissipation area.

As shown in FIG. 3, a first solder mask layer 110 may be further formed on the third wiring layer 108, and a second solder mask layer 111 may be formed on the fourth wiring layer 109. A first solder mask window 1101 and a second solder mask window 1111 are provided in the first solder mask layer 110 and the second solder mask layer 111, respectively.

Referring to FIGS. 4(a)-4(i), there is shown a schematic cross-sectional view of an intermediate structure at each step of a manufacturing method for the circuit prearranged heat dissipation embedded packaging structure 100 of FIG. 2 and the circuit prearranged heat dissipation embedded packaging structure 200 of FIG. 3.

Figure 4A:
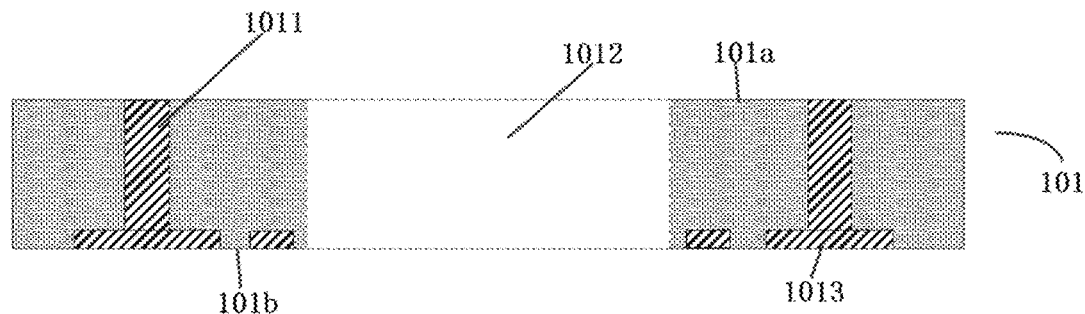
FIGS. 4(a)-4(i) show schematic cross-sectional views of intermediate structures at each step of a manufacturing method for a packaging structure as shown in FIGS. 2 and 3.
Figure 4B:
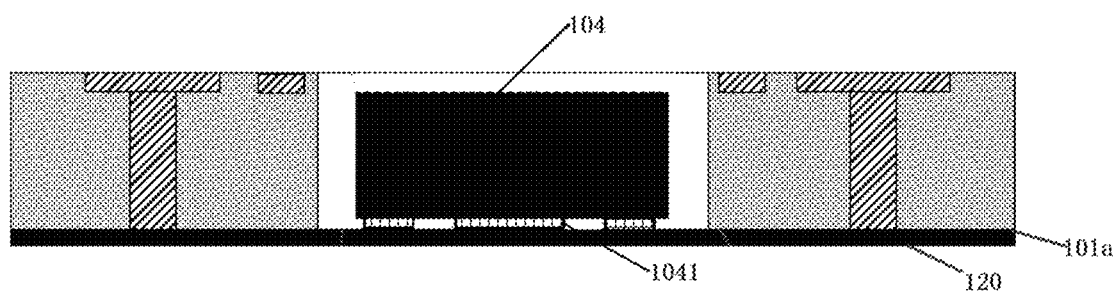
Figure 4C:
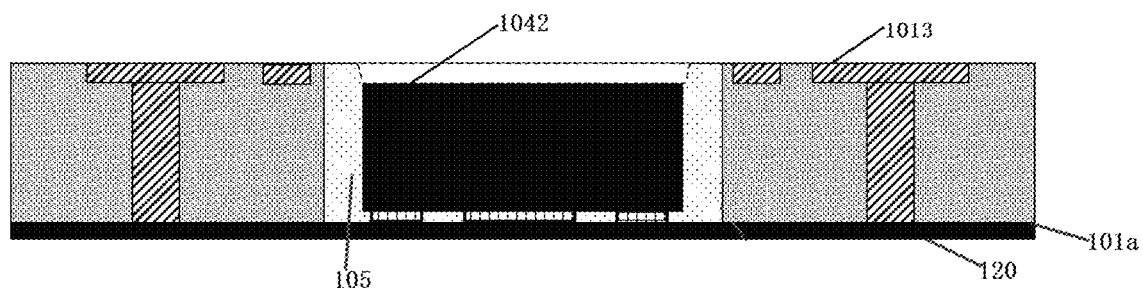
Figure 4D:
Figure 4E:
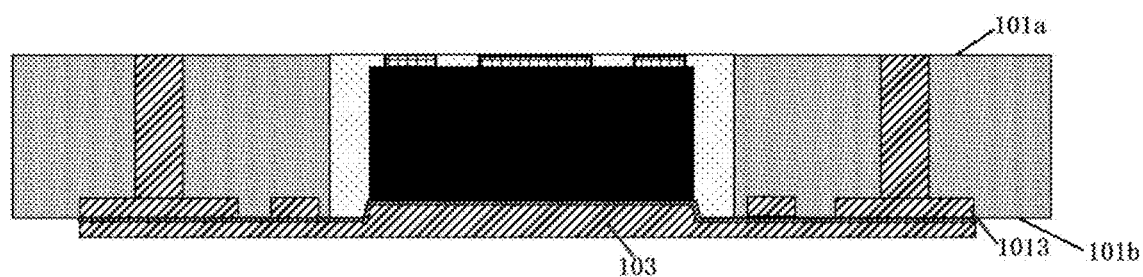
Figure 4F:
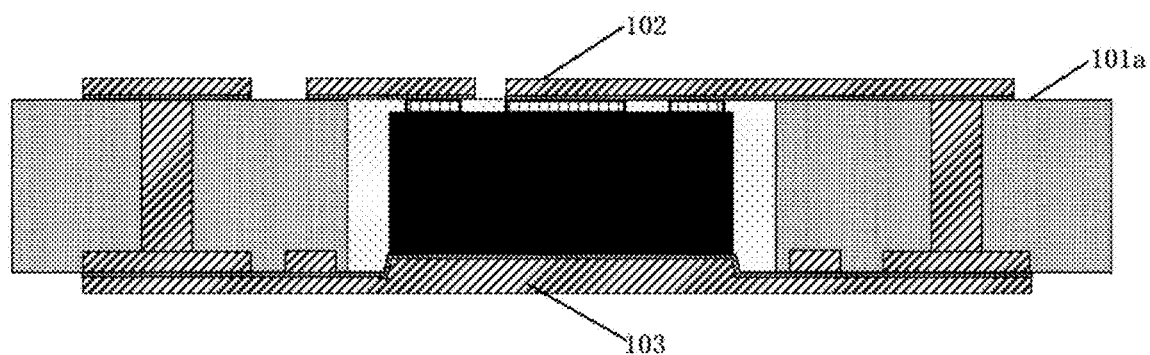
Figure 4G:
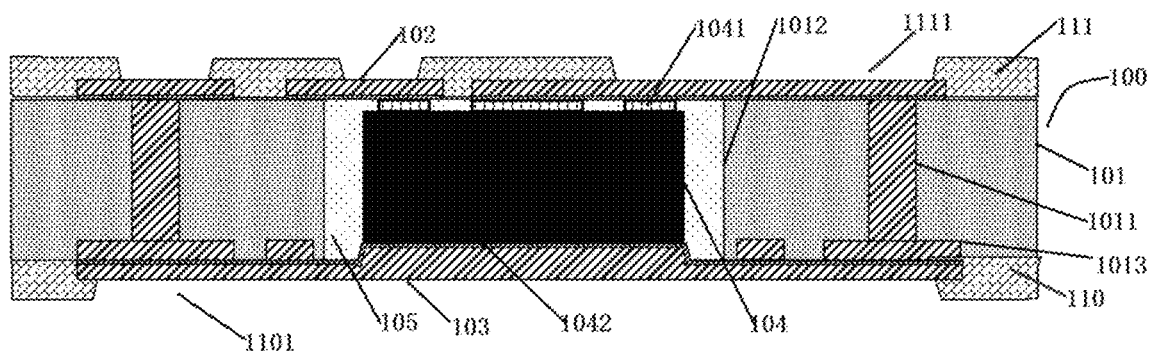
Figure 4H:
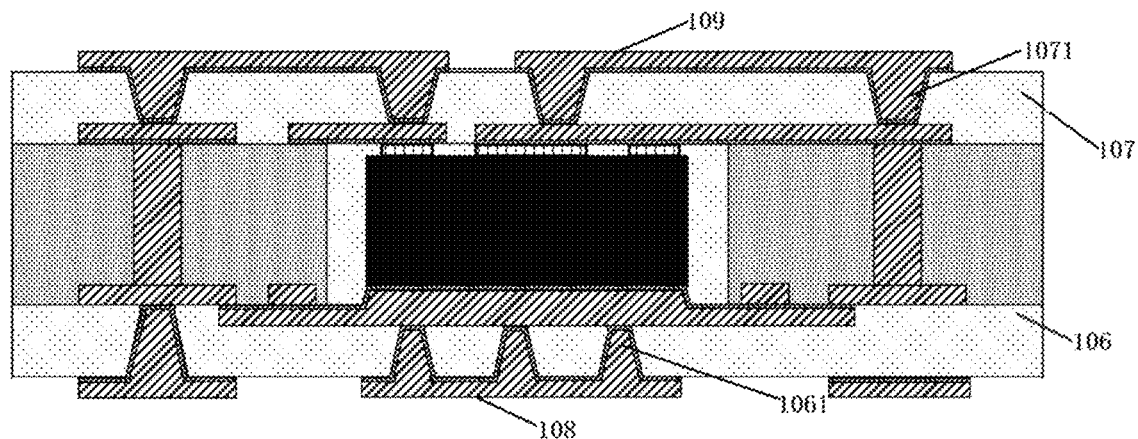

The manufacturing method includes the following steps: preparing a support frame 101-step (a), as shown in FIG. 4(a). The support frame 101 includes a via pillar 1011 passing through the support frame 101, and a through cavity 1012 and a first wiring layer 1013 positioned in the support frame 101. The first wiring layer 1013 is flush with or higher than the lower surface 101b of the support frame 101.

The first wiring layer 1013 is pre-embedded in the lower surface 101b of the support frame 101, and the thickness distribution is uniform, so that glass fiber exposed on the support frame 101 during the preparation of the support frame 101 is covered under the first wiring layer 1013, thereby reducing the reliability problems caused by glass fiber exposure. In addition, the first wiring layer 1013 can further enhance the rigidity of the support frame 101 in the subsequent chip embedding process, thereby improving the warping of the substrate and reducing the risk of plate folding.

The method for pre-embedding the first wiring layer 1013 in the support frame 101 is known and can be realized by means of photolithography plating or copper-clad etching or the like, and is not described in detail herein.

Next, an adhesive layer 120 is applied to the upper surface 101*a* of the support frame 101, and a chip 104 is mounted to the adhesive layer exposed in the through cavity 1012, and the chip terminal face 1041 is mounted to the adhesive layer 120-step (b), as shown in FIG. 4(*b*). The adhesive layer may be a tape, generally the tape being a commercially available transparent film that is thermally decomposable or decomposable under ultraviolet radiation. The chip 104 is arranged within the support frame 101 and the chip terminal face 1041 is mounted to the exposed adhesive layer 120 to fix the position of the chip 104.

Then, the lower surfaces of the chip 104 and the support frame 101 are covered with the dielectric material 105, and the dielectric material 105 is thinned to expose the first wiring layer 1013 and the chip back face 1042-step (c), as shown in FIG. 4(*c*). The dielectric material 105 includes a prepreg (PP), a film-like organic resin (ABF), or a combination thereof; for example, a combination of PP and ABF. Generally, the dielectric material 105 is thinned by a process of nog plate or plasma etching to expose the first wiring layer 1013 and the chip back face 1042; preferably, the dielectric material 105 is firstly thinned by a process of grinding or plasma etching to expose the first wiring layer 1013, followed by a process of plasma etching to expose the chip back face 1042.

Then, the adhesive layer 120 is removed, and a first photosensitive dry film 121 is applied as a first etching stop layer on the upper surface 101*a* of the support frame 101-step (d), as shown in FIG. 4(*d*). Generally, the adhesive layer 110 can be directly removed by heating or ultraviolet light irradiation decomposition.

Next, a heat dissipation layer 103 is formed on the lower surface 101*b* of the support frame 101, and the heat dissipation layer 103 is connected with the first wiring layer 1013, and the first photosensitive dry film 121 is removed-step (e), as shown in FIG. 4(*e*). Generally, the following substeps are included:

depositing a first metal seed layer on the lower surface 101*b* of the support frame 101;
electroplating on the first metal seed layer to form a first metal layer;
applying a first photoresist layer on the first metal layer;
patterning the first photoresist layer to form a first feature pattern;
etching the first metal layer through the first feature pattern to form a heat dissipation layer 103, the heat dissipation layer 103 being in conductive connection with the first wiring layer 1013; and
removing the first etching stop layer and the first photoresist layer and etching away the first metal seed layer.

Generally, the first metal seed layer may be deposited on the lower surface 101*b* of the support frame 101 by an electroless plating or magnetron sputtering process; the first metal seed layer is copper or titanium or an alloy thereof. The first metal seed layer covers the lower surface 101*b* of the support frame 101 and the chip back face 1042. Electroplating at least one of copper, nickel, silver, gold, and alloys thereof on the first metal seed layer in a whole plate to form the first metal layer. The heat dissipation layer 103 is connected with the first wiring layer 1013, the heat dissipation area is increased by using the first wiring layer 1013, the problem of single heat dissipation on the chip back face is solved, and the heat dissipation efficiency is further improved by dispersing heat to the first wiring layer 1013.

Then, a photosensitive dry film is applied as a second etching stop layer on the heat dissipation layer 103, and a second wiring layer 102 is formed on the upper surface 101*a* of the support frame 101, and the second etching stop layer is removed-step (f), as shown in FIG. 4(*f*). Generally, the following substeps are included:

applying a second etching stop layer on the heat dissipation layer 103;
depositing a second metal seed layer on the upper surface 101*a* of the support frame 101;
electroplating copper on the whole plate on the second metal seed layer to form a second metal layer;
applying a second photoresist layer such as a photosensitive dry film on the second metal layer;
patterning the second photoresist layer to form a second feature pattern;
etching the second metal layer through the second feature pattern to form a second wiring layer 102; and
removing the second etching stop layer and the second photoresist layer and etching away the second metal seed layer.

Generally, the second metal seed layer is copper or titanium or an alloy thereof;
the second metal seed layer may be deposited on the upper surface 101*a* of the support frame 101 by an electroless plating or magnetron sputtering process; the second metal seed layer covers the upper surface 101*a* of the support frame 101 and the chip terminal face 1041.

Then, following step (f), a first solder mask layer 110 and a second solder mask layer 111 are prepared on the surfaces of the heat dissipation layer 103 and the second wiring layer 102, respectively, and metal surface treatments are performed respectively to form a first solder mask window 1101 and a second solder mask window 1111-step (g), as shown in FIG. 4(*g*). After the first solder mask layer 110 and the second solder mask layer 111 are prepared, bonding pads can be respectively formed on exposed metals of the heat dissipation layer 103 and the second wiring layer 102, and the bonding pads are subjected to metal surface treatment to form the first solder mask window 1101 and the second solder mask window 1111 respectively; for example, coating green oil and the like.

Next, following step (f), storey-addition may be continued to be performed on the packaging structure-step (h), as shown in FIG. 4(*h*). Generally, the following substeps are included:

laminating a dielectric material 105 on the heat dissipation layer 103 and the second wiring layer 102 respectively to form a first dielectric layer 106 and a second dielectric layer 107;
respectively forming a first via and a second via in the first dielectric layer 106 and the second dielectric layer 107;
depositing a third metal seed layer on the first dielectric layer 106 and in the first via, and depositing a fourth metal seed layer on the second dielectric layer 107 and in the second via;
electroplating copper on the third metal seed layer to form a first copper layer and a first copper pillar 1061, and electroplating copper on the fourth metal seed layer to form a second copper layer and a second copper pillar 1071;

respectively applying a third photoresist layer and a fourth photoresist layer on the first copper layer and the second copper layer;
respectively patterning to form a third feature pattern and a fourth feature pattern;
respectively etching the first copper layer and the second copper layer through the third feature pattern and the fourth feature pattern to form the third wiring layer 108 and the fourth wiring layer 109; and
removing the third photoresist layer and the fourth photoresist layer, and etching away the third metal seed layer and the fourth metal seed layer.

Generally, the first dielectric layer 106 and the second dielectric layer 107 may be the same material or different materials; the first via and the second via may be formed in the first dielectric layer 106 and the second dielectric layer 107 respectively by a laser process. The third metal seed layer and the fourth metal seed layer are titanium or copper or an alloy thereof; the third metal seed layer and the fourth metal seed layer may be formed by an electroless plating or magnetron sputtering process. The first copper pillar 1061 and the second copper pillar 1071 may be solid copper pillars or hollow copper columns with copper plated edges.

Figure 4I:
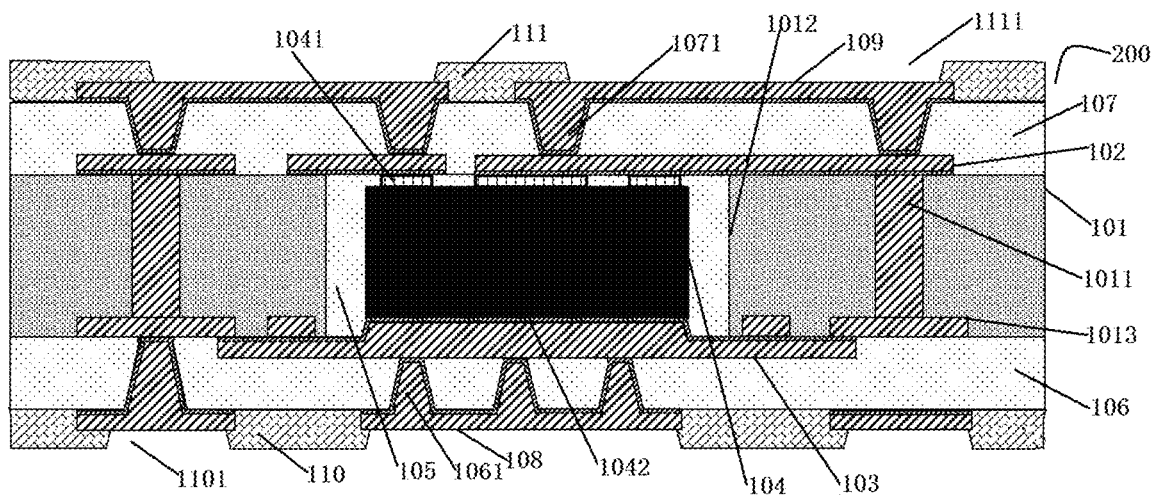

Then, the first solder mask layer 110 and the second solder mask layer 111 may be prepared on the surfaces of the third wiring layer 108 and the fourth wiring layer 109, respectively, and metal surface treatments are performed respectively to form the first solder mask window 1101 and the second solder mask window 1111-step (i), as shown in FIG. 4(i). After the first solder mask layer 110 and the second solder mask layer 111 are formed, bonding pads can be respectively formed on exposed metals of the third wiring layer 108 and the fourth wiring layer 109, and the bonding pads are subjected to metal surface treatment to form the first solder mask window 1101 and the second solder mask window 1111 respectively; for example, coating green oil and the like.

Those skilled in the art will recognize that the invention is not limited to what has been particularly shown and described hereinabove and hereinafter. Furthermore, the scope of the invention is defined by the appended claims, including combinations and subcombinations of the various technical features described hereinabove, as well as variations and modifications thereof, which would occur to persons skilled in the art upon reading the foregoing description.

In the claims, the term "comprising" and variations thereof such as "comprises", "comprise", and the like, mean that the recited assembly is included, but generally other assemblies are not excluded.

What is claimed is:

1. A circuit prearranged heat dissipation embedded packaging structure, comprising:
   at least one chip; and
   a support frame surrounding the at least one chip, the support frame comprising:
      a via pillar passing through the support frame in a height direction;
      a first wiring layer on a first surface of the support frame; and
      a heat dissipation layer on a back face of the chip,
   wherein the first wiring layer is embedded in the support frame, and the outer surface of the first wiring layer is flush with the first surface of the support frame;
   the first wiring layer is in conductive connection with the heat dissipation layer;
   a gap between the chip and the frame is completely filled with a dielectric material;
   a second wiring layer is formed on a terminal face of the chip; and
   the second wiring layer is in conductive connection with the first wiring layer through the via pillar.

2. The circuit prearranged heat dissipation embedded packaging structure according to claim 1, wherein the dielectric material comprises a prepreg, a film-like organic resin, or a combination thereof.

3. The circuit prearranged heat dissipation embedded packaging structure according to claim 1, wherein the support frame comprises an organic electrical insulating material.

4. The circuit prearranged heat dissipation embedded packaging structure according to claim 3, wherein the organic electrical insulating material comprises polyimide, epoxy resin, bismaleimide/triazine resin, polyphenyl ether, polyacrylate, prepreg, film-like organic resin, or a combination thereof.

5. The circuit prearranged heat dissipation embedded packaging structure according to claim 1, wherein the via pillar comprises a copper via pillar.

6. The circuit prearranged heat dissipation embedded packaging structure according to claim 1, wherein a material of the heat dissipation layer is selected from at least one of copper, nickel, silver, gold, and an alloy thereof.

7. The circuit prearranged heat dissipation embedded packaging structure according to claim 1, wherein an additional layer is further provided on the first wiring layer and/or the second wiring layer to form a multilayer interconnection structure, the additional layer comprising an insulating layer and a wiring layer.

8. A method for manufacturing a circuit prearranged heat dissipation embedded packaging structure, the method comprising:
   prefabricating a support frame, wherein the support frame comprises a via pillar passing through the support frame in a height direction, a first wiring layer on a first surface of the support frame, and a through cavity surrounded by the support frame, the first wiring layer being embedded in the support frame, and the outer surface of the first wiring layer being flush with the first surface of the support frame, and the first wiring layer being in conductive connection with the via pillar;
   installing a chip in the through cavity so that a back face of the chip faces the first surface, and completely fills a gap between the chip and the frame with a dielectric material;
   forming a heat dissipation layer on the back face of the chip, and enabling the heat dissipation layer to be in conductive connection with the first wiring layer; and
   forming a second wiring layer on a terminal face of the chip, wherein the second wiring layer is in conductive connection with the first wiring layer through the via pillar.

9. The method of claim 8, wherein the installing of the chip comprises:
   attaching an adhesive layer on a second surface of the support frame;
   sticking and fixing the terminal face of the chip on the adhesive layer;
   applying the dielectric material on the second surface of the support frame to completely fill the gap between the chip and the frame;
   thinning the dielectric material to expose the first wiring layer;

exposing the back face of the chip through plasma etching or laser trepanning; and removing the adhesive layer.

10. The method of claim 8, wherein the support frame comprises polyimide, epoxy resin, bismaleimide/triazine resin, polyphenyl ether, polyacrylate, prepreg, film-like organic resin, or a combination thereof.

11. The method of claim 9, wherein the adhesive layer comprises a tape.

12. The method of claim 8, wherein the dielectric material comprises a prepreg, a film-like organic resin, or a combination thereof.

13. The method of claim 9, wherein the adhesive layer is removed by decomposing the adhesive layer by heating or irradiating ultraviolet light.

14. The method of claim 8, wherein the forming of the heat dissipation layer comprises:

depositing a first metal seed layer on the first surface of the support frame and the back face of the chip;

applying a first etching stop layer on the second surface of the support frame;

performing electroplating on the first metal seed layer to form a first metal layer;

applying a first photoresist layer on the first metal layer;

patterning the first photoresist layer to form a feature pattern;

etching the first metal layer through the first feature pattern to form a heat dissipation layer, wherein the heat dissipation layer is in conductive connection with the first wiring layer; and removing the first etching stop layer and the first photoresist layer and etching away the first metal seed layer.

15. The method of claim 14, wherein the applying of the first etching stop layer comprises electroplating copper, nickel, silver, gold, or an alloy thereof on the first metal seed layer to form a first metal layer.

16. The method of claim 8, wherein the forming of the second wiring layer comprises:

applying a second etching stop layer on the heat dissipation layer;

depositing a second metal seed layer on a second surface of the support frame;

performing electroplating on the second metal seed layer to form a second metal layer;

applying a second photoresist layer on the second metal layer;

patterning the second photoresist layer to form a second feature pattern;

etching the second metal layer through the second feature pattern to form a second wiring layer; and removing the second etching stop layer and the second photoresist layer, and etching away the second metal seed layer.

17. The method of claim 14, wherein the first metal seed layer comprises titanium, copper, or an alloy thereof.

18. The method of claim 8, further comprising:

applying a solder mask layer on the heat dissipation layer and the second wiring layer respectively; and performing surface treatment on exposed metal to form a solder mask window.

19. The method of claim 8, further comprising:

performing semi-additive process on the heat dissipation layer and/or the second wiring layer to form an additional layer to form a multilayer interconnection structure.

20. The method of claim 19, wherein the performing of the semi-additive process comprises:

laminating the dielectric material on the heat dissipation layer and the second wiring layer respectively to form a first dielectric layer and a second dielectric layer;

respectively forming a first via and a second via in the first dielectric layer and the second dielectric layer;

depositing a third metal seed layer on the first dielectric layer and in the first via, and depositing a fourth metal seed layer on the second dielectric layer and in the second via;

electroplating copper on the third metal seed layer to form a first copper layer and a first copper pillar, and electroplating copper on the fourth metal seed layer to form a second copper layer and a second copper pillar;

respectively applying a third photoresist layer and a fourth photoresist layer on the first copper layer and the second copper layer;

patterning the third photoresist layer and the fourth photoresist layer to form a third feature pattern and a fourth feature pattern;

respectively etching the first copper layer and the second copper layer through the third feature pattern and the fourth feature pattern to form a third wiring layer and a fourth wiring layer; and removing the third photoresist layer and the fourth photoresist layer, and etching away the third metal seed layer and the fourth metal seed layer.

\* \* \* \* \*